United States Patent [19]

Imai et al.

[11] Patent Number: 5,482,559

[45] Date of Patent: Jan. 9, 1996

[54] HEAT TREATMENT BOAT

[75] Inventors: Masayuki Imai, Kofu; Takeshi Kurebayashi, Yamanashi, both of Japan

[73] Assignees: Tokyo Electron Kabushiki Kaisha, Tokyo; Tokyo Electron Tohoku Kabushiki, Iwate, both of Japan

[21] Appl. No.: 430,482

[22] Filed: Apr. 28, 1995

Related U.S. Application Data

[62] Division of Ser. No. 206,825, Mar. 8, 1994.

[30] Foreign Application Priority Data

Oct. 21, 1993 [JP] Japan .................................. 5-287786

[51] Int. Cl.$^6$ .............................. C23C 16/00; F27D 3/12
[52] U.S. Cl. ......................... 118/728; 118/724; 118/725; 118/500; 432/245; 432/241
[58] Field of Search ................................... 118/725, 724, 118/728, 500; 29/25.01 B; 432/5, 9–11, 65, 239, 241, 242, 244, 245

[56] References Cited

U.S. PATENT DOCUMENTS

| | | | |
|---|---|---|---|
| 3,226,254 | 12/1965 | Reuschel | 117/201 |
| 5,146,869 | 9/1992 | Bohannon | 118/724 |
| 5,148,714 | 9/1992 | McDiarmid | 74/89.15 |
| 5,162,047 | 11/1992 | Wada | 29/25.01 |
| 5,169,453 | 12/1992 | Takagi | 118/728 |
| 5,192,371 | 3/1993 | Shuto | 118/728 |
| 5,228,501 | 7/1993 | Tepman | 165/80.1 |
| 5,261,776 | 11/1993 | Burck | 414/416 |
| 5,310,339 | 5/1994 | Ushikawa | 432/253 |
| 5,316,472 | 5/1994 | Niino | 432/241 |
| 5,334,257 | 8/1994 | Nishi | 118/500 |

FOREIGN PATENT DOCUMENTS

| | | | |
|---|---|---|---|
| 148283 | 12/1978 | Japan | 29/25.01 B |
| 0244040 | 10/1986 | Japan | 29/25.01 B |
| 0102225 | 5/1988 | Japan | 118/728 |
| 001116 | 1/1990 | Japan | 118/724 |
| 154119 | 5/1992 | Japan | 118/724 |

*Primary Examiner*—R. Bruce Breneman
*Assistant Examiner*—Jeffrie R. Lund
*Attorney, Agent, or Firm*—Beveridge, DeGrandi, Weilacher & Young

[57] ABSTRACT

A heat treatment boat for mounting a number of disc-shaped objects to be treated at a vertical interval for heat treatment thereof in a vertical heat treatment furnace comprises arcuate or ring-shaped support members provided on support rods at a vertical interval for supporting the objects to be treated in surface contact with the undersides of peripheral parts of the objects to be treated. The heat treatment boat is disposed on a ring-shaped intermediate member of high radiant heat absorption disposed on a heat insulating cylinder. The heat treatment boat comprises support rods which are planted on an annular support member circumferentially in accordance with a contour of the objects to be treated and whose upper ends are secured to an annular fixation member. The heat treatment boat of such constitution can reduce occurrences of slips in the disc-shaped objects when heat treated.

3 Claims, 14 Drawing Sheets

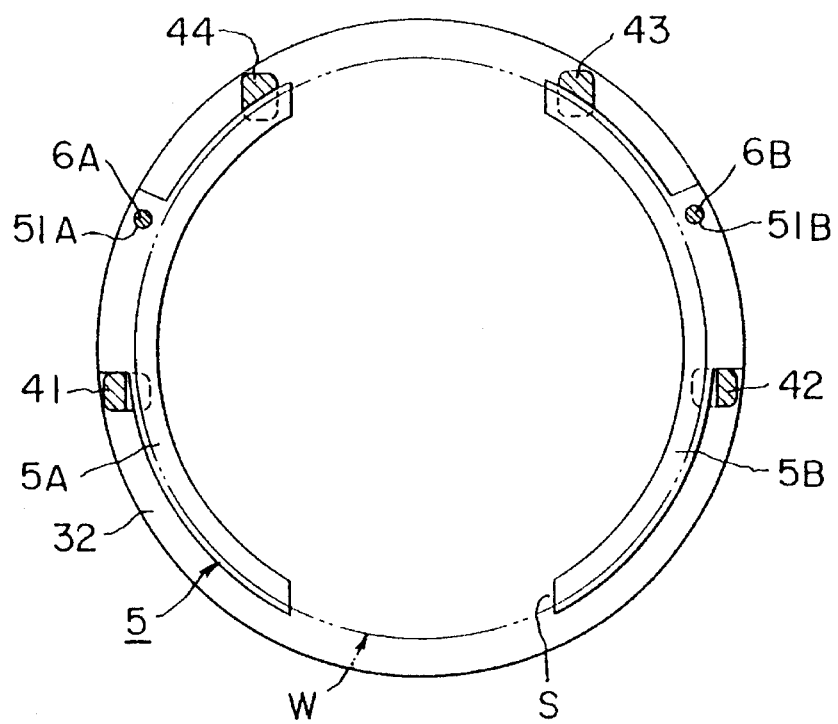
F I G. 5
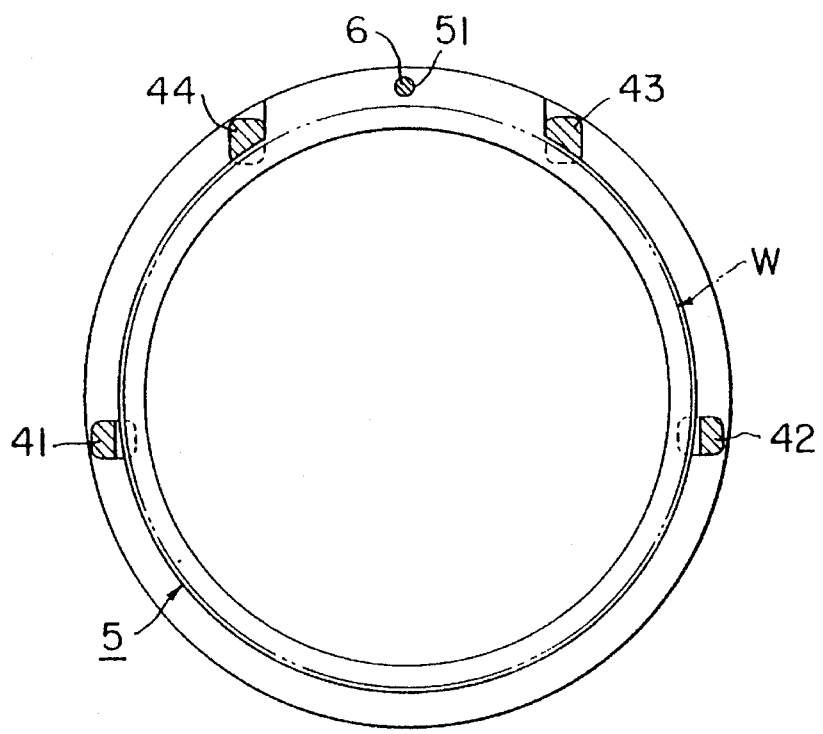
F I G. 6

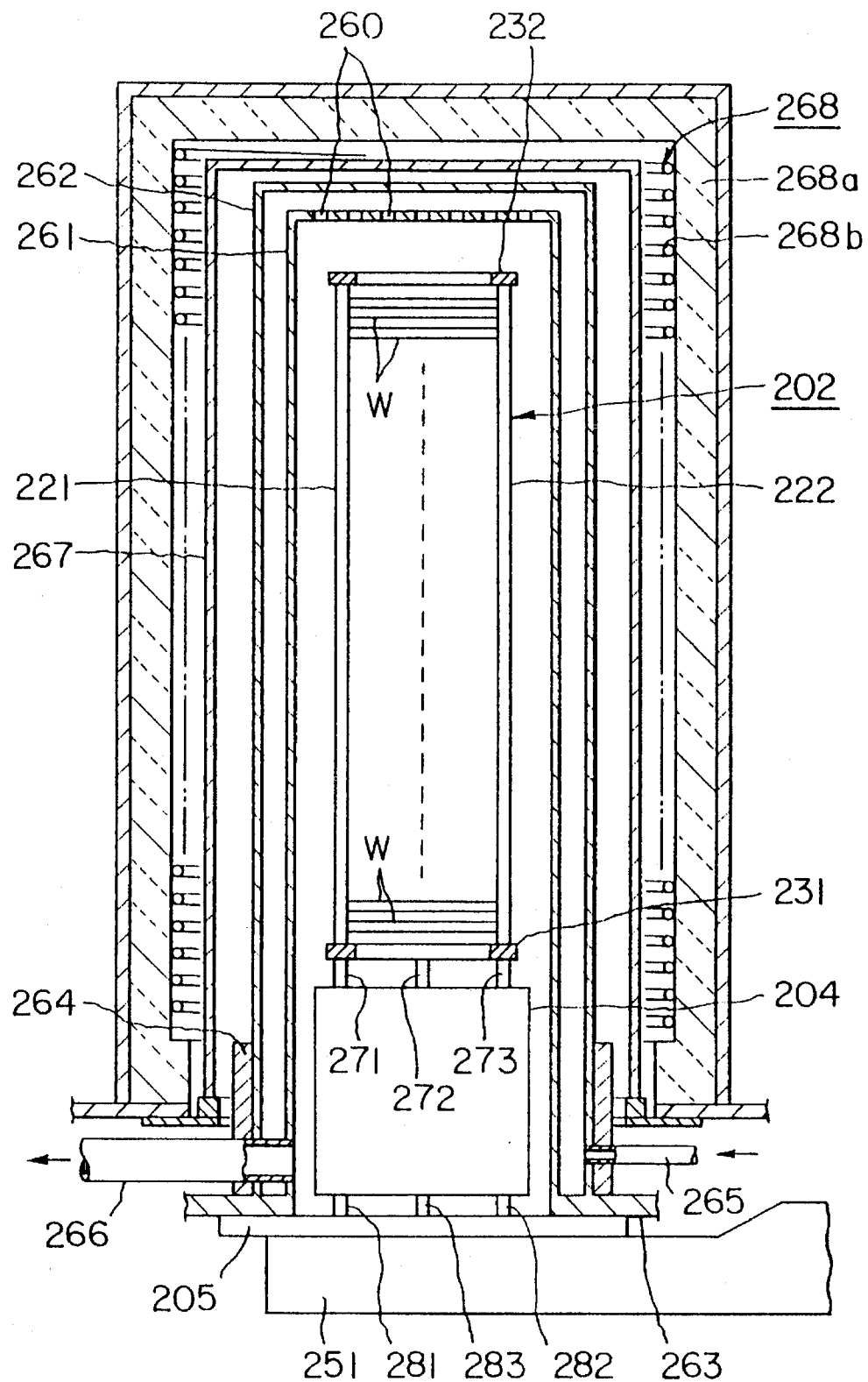
F I G. 16

HEAT TREATMENT BOAT

This is a divisional of application Ser. No. 08/206,825 filed on Mar. 8, 1994, now pending.

BACKGROUND OF THE INVENTION

The present invention relates to a heat treatment boat for heat treating disk-shaped objects to be treated, such as semiconductor wafers.

The semiconductor wafer (hereinafter called "wafer") preparation includes as preparation steps heat treatments at high temperatures for formation of oxide films, diffusion of dopants, etc. As apparatuses for such heat treatments horizontal heat treatment furnaces have been dominant, but recently vertical heat treatment furnaces are increasingly used because they draw in less outside atmosphere.

A vertical heat treatment apparatus using a vertical heat treatment furnace uses a vertical heat treatment boat (also called "wafer boat") for mounting a number of wafers at a set vertical interval to load/unload the wafers into the heat treatment furnace.

FIG. 18 shows a conventional heat treatment wafer boat. The conventional heat treatment wafer boat 1 includes four support rods of 13–16 of, e.g., quartz erected between a disk-shaped top plate 11 and a disk-shaped bottom plate 12. Two 13, 14 of the support rods respectively support the wafers at the front left and right in the direction of advance of the wafers W as viewed in FIG. 18, and the rest two 15, 16 of the support rods support the wafers at the rear left and right in the direction of advance of the wafers as viewed in FIG. 18. The wafer boat 1 is provided on a heat insulation cylinder 2 which is a heat insulating material.

As shown in FIG. 19, each support rod 13–16 have grooves 17 with a vertical width which is a little larger than a thickness of the wafers W so that the respective grooves support the respective wafers W at the undersides of the peripheral portions. The wafers W are put in/out of the grooves 17 by a transfer arm 21 in the direction of the arrow between the two front support rods 13, 14.

Such structure of the heat treatment boat 1 has been used in the conventional horizontal heat treatment furnaces and is used as it is in the vertical heat treatment furnaces. That is, in the horizontal heat treatment furnace, the wafers are transferred by a push-up mechanism for pushing up the wafers from below the heat treatment boat and a mechanism for holding the lifted wafers W. Such transfer has determined a structure of the heat treatment boat.

In the heat treatment boat 1 of FIG. 18, when a set number of wafers W to be treated are mounted on the boat 1, an elevator 22 is lifted to load the boat into the heat treatment furnace, so that the wafers W are loaded in the heat treatment furnace to be subjected to a required heat treatment.

In a heat treatment for processing wafers, e.g., to diffuse dopant ions implanted in the wafers down to a set depth, the wafers are heated at a high temperature of about 1200° C. for a long period of time. In this case, the substrate material of the wafers is silicon, since the melting point of silicon is 1410° C., the silicon wafers have an extremely low yield stress at 1200° C.

On the other hand, wafers tend to increase their diameters. Their size is increasing from 6 inches to 8 inches, and further 12 inch-diameter wafers are being studied. In wafers of such large diameters, when the wafers are heat treated at a temperature near a melting point of their substrate material, crystal deformations called slip tend to occur near portions of the wafers at which the wafers are supported by the support rods of the heat treatment boat. These slips are fine faults which are invisible but can be seen by magnifying glasses, microscopes. etc.

As shown in FIG. 18, the top and the bottom plates 11, 12 of the wafer boat 1 are heated by a heater in the furnace, and because of no heaters above and below the wafer boat 1 heat is radiated as secondary radiant heat from the top and the bottom plates 11, 12. Since the top and the bottom plates 11, 12 are plane bodies, amounts of the radiant heat are considerably large. Accordingly heat is conducted from the support rods 11–14 of the wafer boat to the top and the bottom plates 11, 12, i.e., from the wafers W to the support rods to the top and the bottom plates 11, 12, temperature gradients occur in the peripheral portions of the wafers W.

To consider the occurrences of the slips, the micro-areas of the wafers in actual contact with the grooves 17 as shown in FIG. 20 are noted. Large stresses will be applied to these micro-areas as described above, and large temperature differences will take place there, so that large thermal stresses will be applied thereto, and planes of the wafers W will be displaced past each other from the bottom to the top of the wafers W, causing the slips. It is considered that larger calories flow especially from those of the wafers nearer to the top and the bottom ends of the wafer boat 1 to the top and the bottom ends thereof, so that the slips tend to occur in those wafers W. When the slips occur in the regions of the wafers W for the devices to be formed in, the devices will be defective with low yields.

Causes for the slips will be 1) internal stresses due to an own weight of the wafers W, and 2) thermal strain stresses due to disuniform temperatures in plane of the wafers W. In connection with the cause 1), the support positions by the heat treatment boat 1 are located on the peripheral parts of the wafers and partially at four positions, so that large internal stresses will occur due to an own weight of the wafers near the supported parts, and the slips will occur when the internal stresses exceed a certain magnitude. In addition, wafers have soris(bendings) not only within the allowed range, but also due to temperature distributions when heated. Furthermore, a width of the grooves in the support rods have manufacturing errors, If the wafers should be apart from any one of the four support positions because of any of these causes, the wafers would be supported only at three of the four support positions, so that, as seen from the layout of the support rods 13–16, a load at the respective support positions will become imbalanced, with the result a large stress exceeding a threshold for the occurrence of the slips will take place at one of the four support positions.

As regards the cause 2) above, when the wafers are heated, heat is supplied and removed through the support rods of the heat treatment, so that temperature differences take place between the central parts of the wafers and the peripheral parts thereof, and thermal strain stresses occur. The slips will occur when the thermal strain stresses exceed a certain magnitude.

Thus, in heat treating wafers, especially in heat treating wafers at a high temperature near a melting point of the substrate of the wafers, as the wafers have larger diameters, the problem of the slips take place. This problem is a serious obstacle to increasing diameters of wafers.

A further cause which is considered for causing the slips is thermal strain stresses due to disuniform temperatures in plane of wafers. With reference to FIG. 21, heat is supplied and removed through support rods 3A of a wafer boat 3 when wafers W are heated. Accordingly temperature differences take place between the central parts of the wafers and the peripheral parts thereof, with a result of occurrence of thermal strain stresses. The slips will occur when the thermal strain stresses exceed a certain magnitude. The slips tend to occur especially in lower part of the wafer boat 3.

The reason for this will be as follows. In a case that a heat treating temperature is above, e.g., 1000° C., the wafer boat 3 is loaded into a reaction tube 1 which has been pre-heated up to about 800° C., and when the wafers W are heated up to an atmospheric temperature, the temperature in the reaction tube 1 is raised up to a set heat treating temperature. Quartz forming the reaction tube 1 has the low heat conductivity and has good properties as a heat insulating material. On the other hand, because of its high light transmittance, quartz does not much absorb radiant heat and is slow to be heated. Accordingly a heat insulator 2 is behind the wafer boat to be heated until the wafer boat 3 is loaded in the reaction vessel 1 and has a stabilized atmospheric temperature and until the interior of the reaction tube 1 is heated up to a set temperature, so that heat escapes due to a temperature difference between the two from the lower part of the wafer boat 3 to the heat insulator 2, and a temperature of the lower part of the wafer boat 3 cannot be easily raised. As a result, temperature differences occur between parts of the wafers W supported by the wafer boat 3, and the rest parts of the wafers W, and the slip will easily take place.

SUMMARY OF THE INVENTION

In view of the above-described circumstances, the present invention was made, and an object of the present invention is to provide a heat treatment boat which can reduce occurrences of slips in heat treating disc-shaped objects to be treated.

The present invention relates to a heat treatment boat for mounting a number of disc-shaped objects to be treated at a certain vertical interval for heat treating the object to be treated in a vertical heat treatment furnace in which a number of arcuate or ring-shaped support members are provided on support rods at a vertical interval, the support members being formed of the same material as the objects to be treated, and supporting the objects to be treated in surface contact with the undersides of peripheral parts of the objects to be treated.

The present invention also relates to a heat treatment boat for mounting a number of disc-shaped objects to be treated at a vertical interval for heat treating the objects to be treated in a vertical heat treatment furnace in which a number of arcuate or ring-shaped support members for supporting the objects to be treated in surface contact with the undersides of peripheral parts of the objects to be treated are removably provided on support rods at a vertical interval.

According to the present invention, the objects to be treated, e.g., wafers are supported with outer peripheral parts thereof in surface contact with the support members. Accordingly internal stresses near the supported parts due to own weights of the objects to be treated are more mitigated than those in the conventional four point support, and even when an object to be treated has sori (bending), because of the large supported area no large load is applied to one part. Furthermore, disuniform temperature distributions along the outer peripheries of the objects to be treated are mitigated. Since the support members are formed of the same material as the objects to be treated, temperature rising and falling rates in a heat treatment are equal. Accordingly temperature differences in plane are small, and thermal strain stresses are considerably mitigated.

The support members are removable from the support rods. This facilitates their fabrication in comparison with one-piece type. By preparing various types of support members suitable for transfer modes of the objects to be treated, when a transfer mode is changed, a suitable type of support members can be selected.

The present invention relates to a heat treatment boat which is disposed on a heat insulating unit of a heat insulating material and includes a number of plate-type objects to be treated provided at a vertical interval, the heat treatment boat being loaded from below into a vertical reaction tube forming a heat treatment region, the heat treatment boat being disposed on the heat insulating unit through an intermediate member of high radiant heat absorption.

In this structure, when the heat treatment boat is loaded into a reaction tube and heated, the intermediate member, whose radiant heat absorption is high, quickly raises temperatures. Since the lower end of the heat treatment boat is in contact with the intermediate member or connected in one-piece, temperature differences between the lower part of the heat treatment boat and the intermediate member are small. Accordingly radiation from the lower part of the heat treatment boat to the heat insulating unit is suppressed, with a result that temperature disuniformity in plane of the objects to be treated is mitigated, and occurrence of slips is suppressed.

The present invention relates to a heat treatment boat for supporting a number of objects to be treated at a vertical interval along a plurality of vertically extended support rods, the heat treatment boat comprising an annular support member for supporting lower ends of the support rods, and an annular fixation member for positioning the upper ends of the support rods with each other.

In this structure, when objects to be treated are mounted on the heat treatment boat and loaded in a reaction tube, and the interior of the reaction tube is heated secondary radiation take place on the upper and lower ends of the heat treatment boat. But the support members and the fixation members provided on the upper end and the lower end are annular, and radiated calory is small. Calories conducted to the upper ends and the lower ends of the support rods are accordingly small, and calories conducted from the peripheral parts of the objects to be treated to the support rods are small. As results, temperature uniformity in plane of The objects to be treated is high, and accordingly thermal stresses in the peripheral parts are small, and occurrence of slips can be suppressed. The heat treatment boat is supported on a heat insulating unit through a plurality of islands, or a plurality of islands are provided between the heat insulating unit and the cap body, whereby calories conducted from the heat treatment boat to the heat insulating unit and the cap body can be reduced also with the result that occurrence of slips can be suppressed.

BRIEF DESCRIPTION OF THE DRAWINGS

FIG. 5 is a plan view of a modification of the wafer support member of FIG. 3.

FIG. 6 is a plan view of another variation of the wafer support member of FIG. 3.

FIG. 16 is a vertical sectional view of another variation of the heat treatment boat of FIG. 11, which shows the heat treatment boat is loaded in a heat treatment furnace.

DETAILED DESCRIPTION OF PREFERRED EMBODIMENTS

First Embodiment

The heat treatment boat according to a first embodiment of the present invention will be explained.

Figure 1:
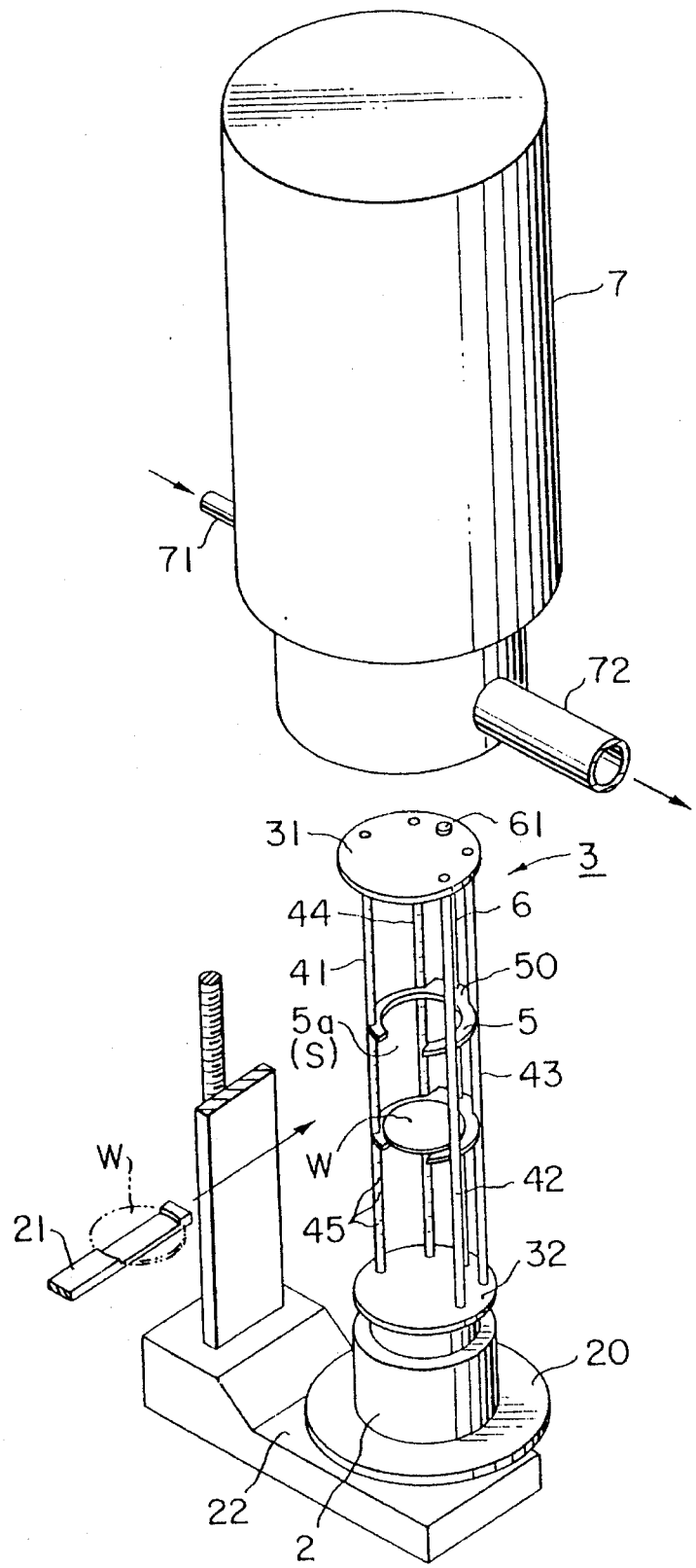
FIG. 1 is a perspective view of the heat treatment boat according to a first embodiment of the present invention showing a general structure thereof.
Figure 2:
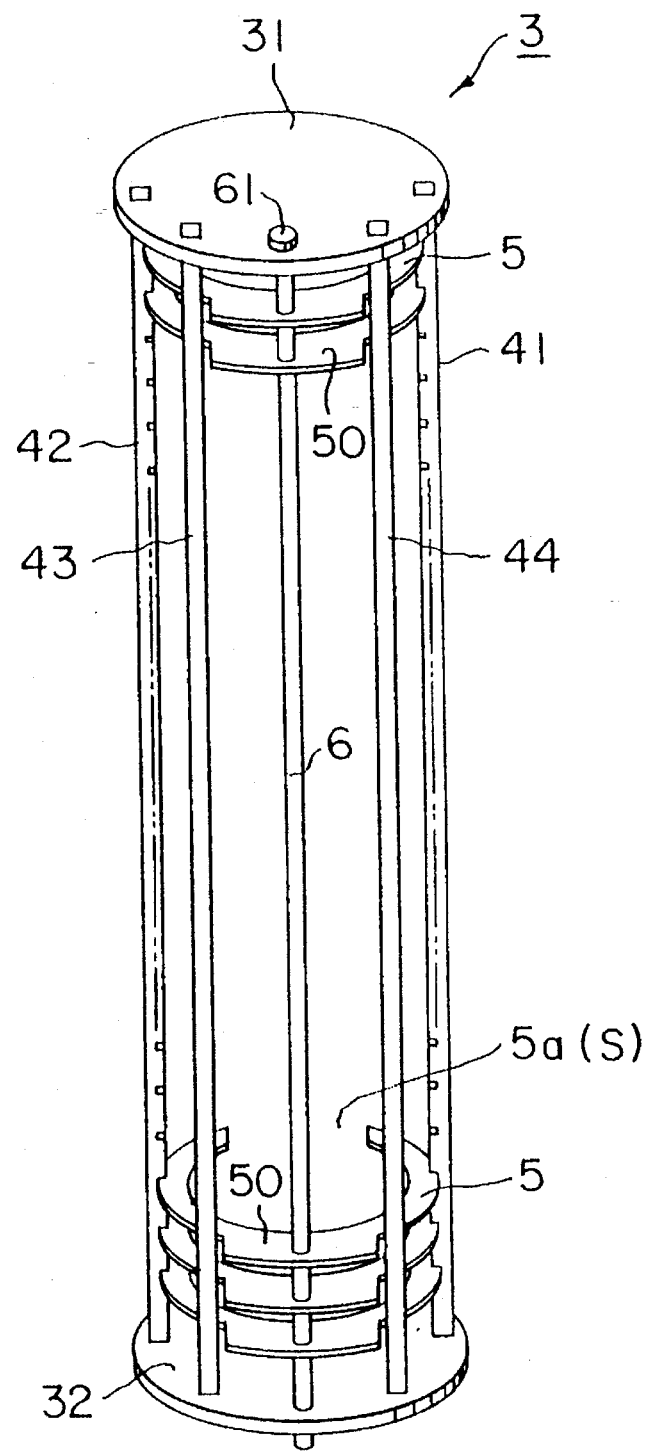
FIG. 2 is a perspective view of the heat treatment boat of FIG. 1.
Figure 3:
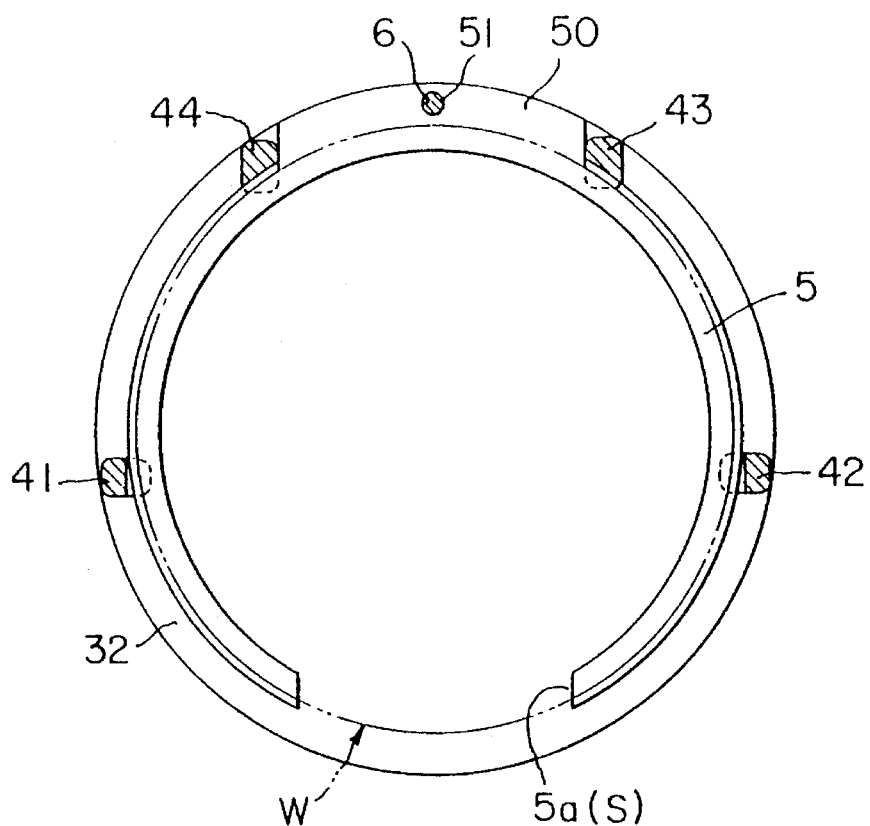
FIG. 3 is a plan view of the wafer support member of the heat treatment boat of FIG. 1.
Figure 4:
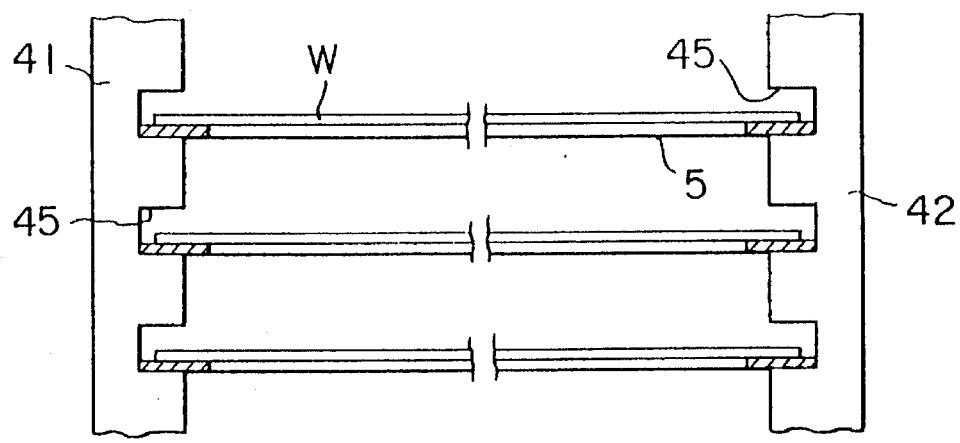
FIG. 4 is a partial vertical sectional view of the heat treatment boat of FIG. 1.

FIG. 1 is schematic respective view of a part of a vertical heat treatment apparatus including the heat treatment boat according to the first embodiment of the present invention. FIGS. 2 to 4 are views of parts of the heat treatment boat of FIG. 1. The heat treatment boat 3 according to this embodiment is used in heat treating disk-shaped wafers, objects to be treated. Hereinafter the heat treatment boat is called as "wafer boat", and an object-to-be-treated support member is called wafer support member.

As shown in FIG. 1, the wafer boat 3 includes a circular top plate 31 and a circular bottom plate 32 of, e.g., SiC, provided on the top and the bottom thereof and opposed to each other, and four support rods 41–44 of, e.g., SiC or polysilicon secured between the top and the bottom plates 31, 32. 150 sheets, for example, of wafer support members 5 are provided parallel with each other at a certain interval between the top and the bottom plates 31, 32. When the wafers W are formed are silicon wafers, the support members 5 are formed of the same material as the wafers, i.e., polysilicon.

Each of the support members 5 has an arcuate recess 5a of a size sufficient to let in between, e.g., the support arms 41, 42 a transfer arm 21 which will be described later, and has an inner diameter smaller than an outer diameter of the wafers W and is horseshoe-shaped. As shown in FIG. 4, a peripheral part of each support member 5 is inserted in four grooves 45 respectively formed in the support rods 41–44 with a peripheral surface horizontally supported on the bottom surface of the grooves 45 and the circumferential surface in contact with the sides of the grooves 45.

A part of each wafer support member 5 located between the support rods 43, 44 (a rear part when a part thereof through which a wafer W is transferred is called front part) has an outwardly enlarged outer diameter than the rest part, and as shown in FIG. 3, a projected part 50 having a through-hole 51 formed in the central part is formed thereon. A fixation shaft 6 is passed through the through-holes 51 of the respective support members 5 for positioning stationary the wafer support members 5 with respect to the support rods.

As shown in FIG. 2, the fixation shaft 6 has on the top a locking portion 61 larger than the through-hole of the top plate 31 for prohibiting the shaft 6 from falling through the top plate 31. The lower end of the shaft 6 is not secured to the bottom plate 2 but passed therethrough, so that the shaft 6 can be pulled out of the top plate 31. The recesses 5a of the respective wafer support members 5 define entrance spaces for a transfer mechanism, e.g., the transfer arm 21 to clear so as to transfer the wafers onto/from the wafer boat 3.

As shown in FIG. 1, the wafer boat 3 having the above-described structure is removably mounted on a heat insulating cylinder 2 having a flange 20 on the bottom. The heat insulating cylinder 20 is mounted on a boat elevator 22. A vertical furnace 7 is provided above the wafer boat 3. Reference numeral 71 represents a gas feed pipe for supplying required gases into a reaction tube in the vertical furnace 7, which is invisible as viewed in the drawings. Reference numeral 72 indicates an exhaust pipe for exhausting the interior of the reaction tube.

Next the operation of the first embodiment will be explained. A wafer W to be treated is put into the wafer boat 3 by the transfer arm 21 through the recess 5a (the entrance spaces S) of a wafer support member 5, is positioned right above the wafer support member 5, then the transfer arm 21 is lowered relatively to the wafer boat 3, and the wafer W is transferred onto the wafer support member 5 of the wafer boat 3. The wafer W is supported with a peripheral part thereof in surface contact with the upper surface of the wafer support member 5

Wafers W are transferred onto the wafer support members 5, e.g., up to down. When a set number of sheets of wafers W, e.g., 150 sheets have been loaded into the wafer boat 3, the boat elevator 22 is lifted to load the wafers W into the vertical furnace 7. When the wafers are heat treated at about 1200° C., the interior of the vertical furnace 7 has been pre-heated up to about 800° C. and is heated up to about 1200° C. after the wafers W have been loaded, and a required heat treatment is conducted. When the heat treatment is over, the boat elevator 22 is lowered to unload the wafers W out of the vertical furnace 7. then the wafers W are dismounted from the wafer boat 3 in the operation reverse to the above-described operation.

In the first embodiment, the respective wafers W are supported in surface contact with the large arcuate surface of the wafer support members. Internal stresses applied to the wafers W are accordingly small, and even if parts of the outer peripheral portions of the wafers W should float from the wafer support members 5 because of sori, the rest parts of the wafers W are supported on the peripheral surfaces of the wafer support members without excessive loads applied to one portions of the respective wafers as is in the conventional four-point support. As a result occurrences of the slips can be reduced. In the case that silicon wafers are used, since the melting point of silicon is 1410° C., the above-described structure is very effective for heat treatments at above about 1000° C.

Because of the large support surfaces of the wafer support members 5, disuniformity of temperature distributions along the outer periphery of the wafers W can be reduced. Because the wafer support members 5 and the wafers W are formed of the same material, both have the same temperature increases and decreases in a heat treatment, and a temperature difference of the wafers W between the central parts and the peripheral parts is small. As a result thermal strain stresses can be considerably mitigated. That is, the wafers W and the wafer support members 5 have the same radiant heat absorption and heat conductivity, and accordingly heat deflections (temperature differences) between the parts of the wafers W in contact with the wafer support members 5 and the rest part of the wafers W can be suppressed, with a result that occurrences of slips due to the heat deflections can be decreased.

The wafer support members 5 can be removed from the support rods, which facilitates the fabrication of the heat treatment boat. In the first embodiment the wafer support members and the support rods may be formed in one-piece, but the one-piece formation limits their shapes. It is advantageous that the wafer support members 5 are removable from the support rods.

Additionally the maintenance of the wafer support members 5 is facilitated. For example, one of the wafer support members 5 is damaged, the fixation shaft 6 is pulled out to remove only the damaged wafer support member and replace it with a new one. This is far economical in comparison with a total displacement of the wafer support members. In addition, as will be explained later, the wafer support members can be of various types and may be displaced by the wafer support members of a type in accordance with a transfer method of the wafers.

Next, one example of variations of the heat treatment boat according to the present invention will be explained. FIG. 5 shows a wafer support member involved in the example of variations. In this example, each wafer support member 5 comprises two separate semi-arcuate members 5A, 5B. The semi-arcuate members 5A, 5B are inserted into grooves of support rods 41–44 and supported horizontal by their own weights. Fixation shafts 6A, 6B are inserted in through-holes 51A, 51B formed in the respective semi-arcuate members 5A, 5B. The two semi-arcuate members 5A, 5B define an entrance space S therebetween for a transfer arm 21 which is a transfer mechanism for transferring wafers W onto a wafer boat 3.

FIG. 6 shows another example of variations of the heat treatment boat according to the present invention. In this example, each wafer support member 5 is in the form of a ring without recesses. Each wafer support member 5 has no entrance space S for a transfer arm 21 to clear, which disenables the use of the wafer transfer mode of FIG. 1. For this reason, push-up means 8 as shown in FIG. 7 is disposed below a port stage 9.

Figure 7:
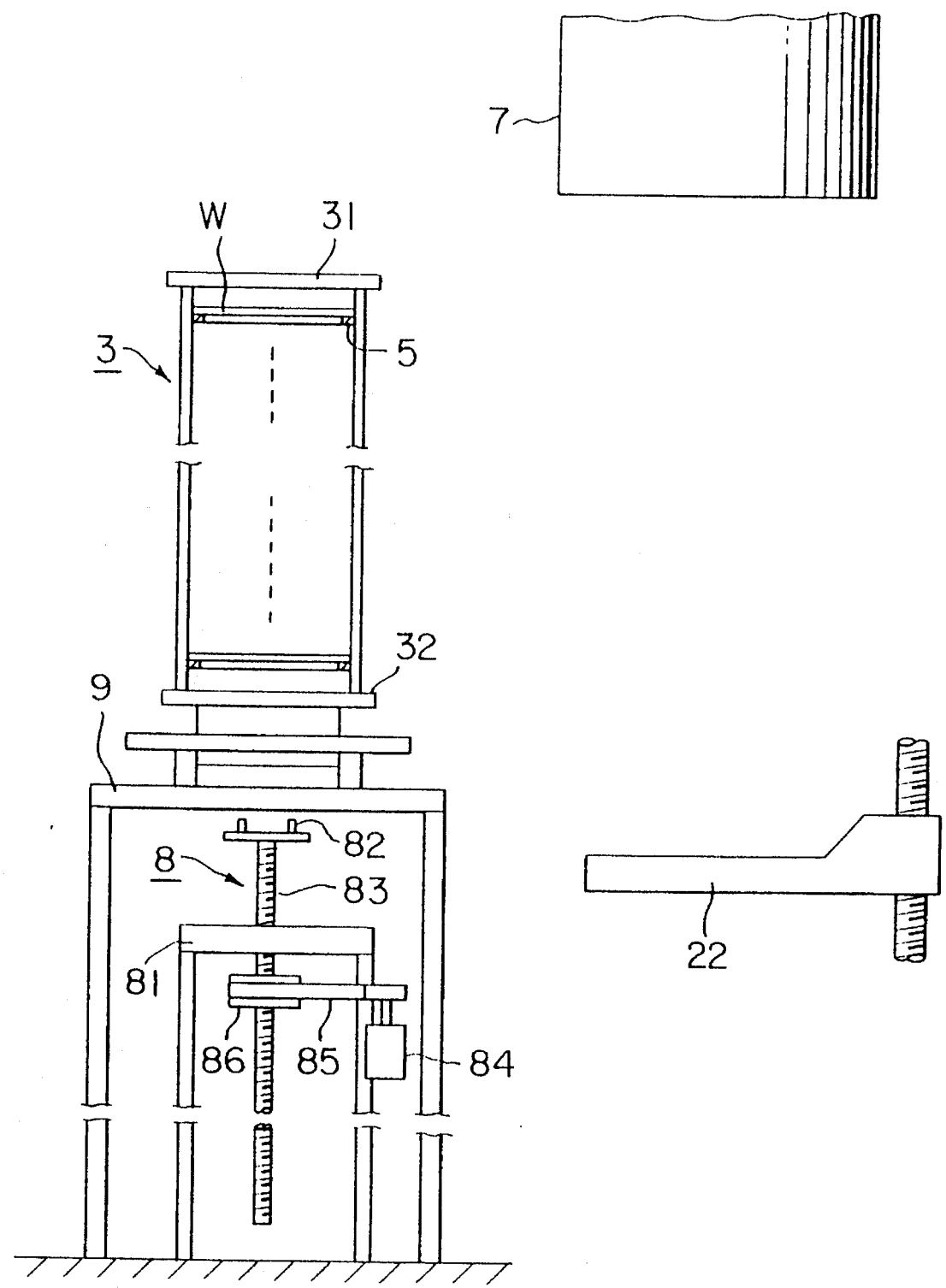
FIG. 7 is a schematic explanatory view (front view) of a wafer transfer mode using the wafer support member of FIG. 6.

As shown in FIG. 7, the push-up means 8 comprises a pole screw 83 which is screw-engaged with a fixation table 81 and has a push-up portion 82, a motor 84 disposed on the fixation table 81, and a pulley which is screw-engaged with the pole screw 83 and is rotated by the motor 84 by a belt 85. In using such push-up means 8, the wafer boat 3 is disposed on the port stage 9 which is independent from the boat elevator 22. A wafer W to be treated is introduced inbetween the neighboring wafer support members 5, 5 and is positioned right above the wafer support member 5. Then the motor 84 is driven to rotate the pole screw 83 to lift the push-up portion 82 in the wafer boat 3, so that the wafer W on the transfer arm 21 is pushed up from below. With the wafer W afloat, the transfer arm 21 is drawn out, and the motor 84 is reversely rotated to lower the push-up portion 82 to transfer the wafer W onto the wafer support member 5. Thus, a peripheral portion of the wafer W is supported on the ring-shaped wafer support member 5 in surface contact with the upper surface of the wafer support member 5. Such transfer of the wafer W is conducted sequentially, e.g., up to down, and when a set number of sheets of wafers, e.g., 150 sheets have been mounted on the wafer boat 3, the wafer boat 3 is transferred onto a boat elevator 22. Then the boat elevator 22 is lifted and loaded in a vertical furnace 7, and a required heat treatment is conducted on the wafers. Then the boat elevator 22 is lowered, and the wafers W are unloaded from the vertical furnace 7. Then the operation reverse to the above is conducted to take the wafer out of the wafer boat 3.

Thus, because the wafer support members 5 are removably mounted on the support rods 41–44, even in various wafer transfer modes, the wafer boat comprising the top plate and the bottom plates 31, 32, and the support rods 41–44 can be thus used as it is with only the wafer support members suitably replaced, whereby the wafer boat can be universally applicable to various wafer transfer modes.

In the above described embodiment, the wafer support members are formed of the same material as wafers, and the wafer boat includes the wafer support members removably mounted on the plural support rods, but the wafer boat is not necessarily limited to this constitution. According to the present invention, 1) the wafer support members are formed of the same material as wafers, and the wafer support members are secured to the support rods, and 2) the wafer support members are formed of a different material from wafers, and the wafer support members are removable from the support rods.

According to the first embodiment, the objects to be treated are supported with peripheral parts thereof in surface contact with the arcuate or ring-shaped object-to-be-treated support members. As a result internal stresses of the objects to be treated are mitigated. The object-to-be-treated support members are formed of the same material as objects to be treated. As a result, thermal strain stresses are considerably mitigated with a result of few occurrences of slips in the objects to be treated.

According to the first embodiment, internal stresses of objects to be treated are mitigated, and slips of the objects to be treated can be decreased. The object-to-be-treated support members are removable from the support rods. As a result the wafer boat can be easily fabricated, and when a part of the object-to-be-treated support members is damaged, the damaged one can be easily replaced with new one. In addition the object-to-be-treated support members can be replaced with those suitable to various wafer transfer modes.

Second Embodiment

Figure 8:
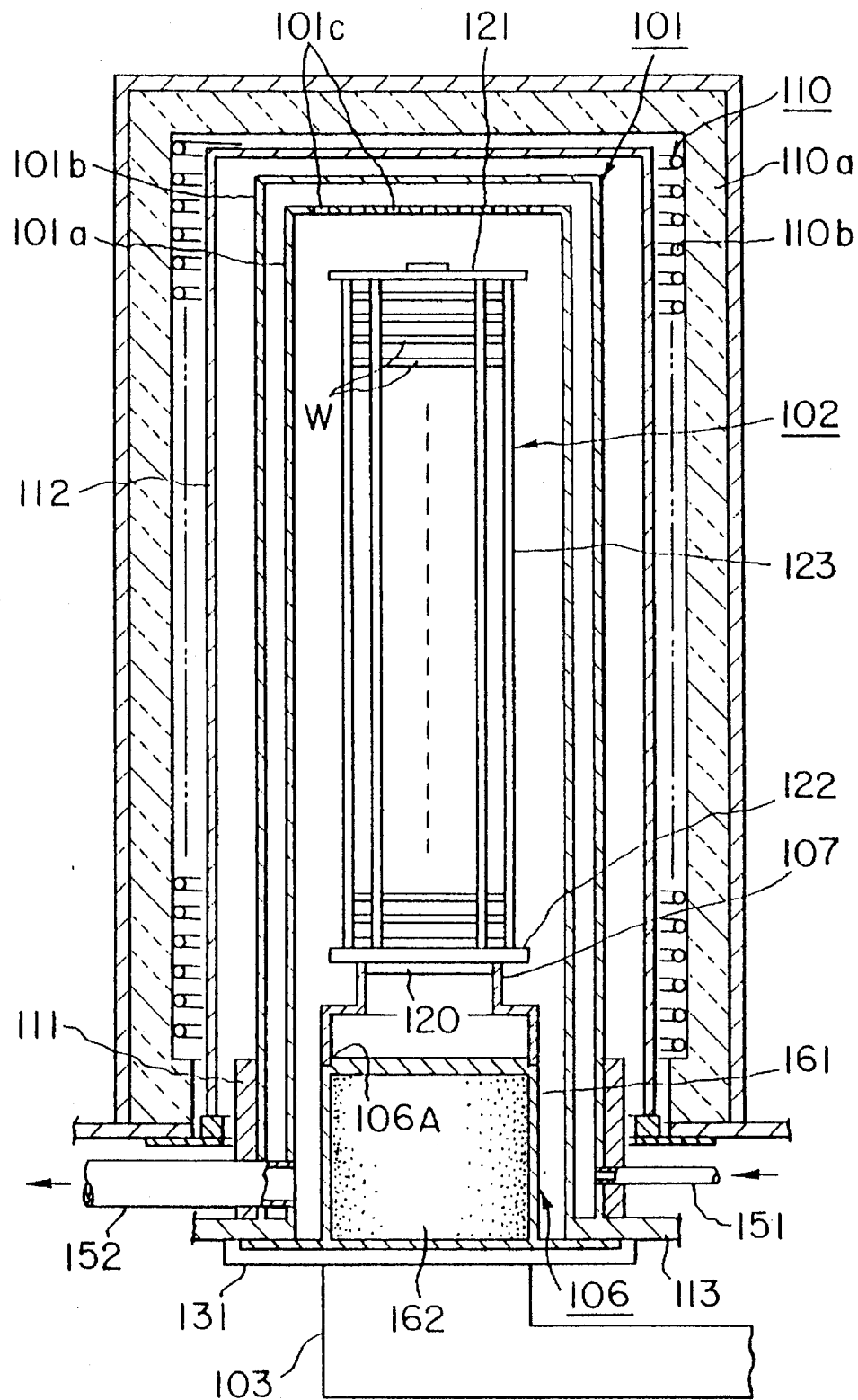
FIG. 8 is a vertical sectional view of the heat treatment boat according to a second embodiment of the present invention, which shows the heat treatment boat is loaded in a heat treatment furnace.

Next a second embodiment of the present invention will be explained. FIG. 8 shows the heat treatment boat according to the second embodiment which is applied to an oxidation and diffusion furnace. In FIG. 8 wafers, objects to be treated are loaded in a reaction tube. The reaction tube 101 which is a heat treatment region has a double tube structure of an inner tube 101a and an outer tube 101b which are respectively arranged vertical and is secured at a flange 113 on the bottom to a base plate not shown. The outer periphery of the lower end portion of the reaction tube 101 surrounded by a heat insulating material 111. In the top of the inner tube 101a there are formed a number of small holes 101c as gas passages. A gas feed pipe 151 is connected to a side of the outer tube 101b. An exhaust pipe 152 is connected to an inner tube 101a for exhausting the reaction tube 101.

A cylindrical liner tube 112 of, e.g., SiC surrounds the reaction tube 101 on the outside thereof. A heater 110 surrounds the liner tube 112 on the outside thereof. The heater 110 includes a coil of a resistance heating line 110b inside of a heat insulating layer 110a.

Figure 9:
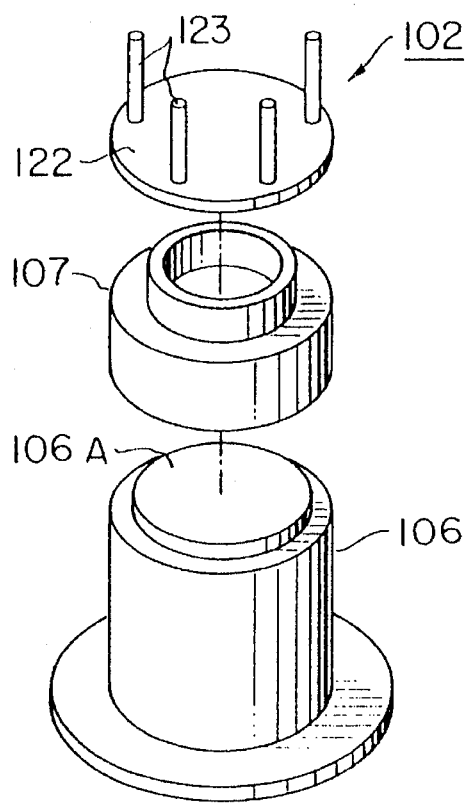
FIG. 9 is a perspective view of a major part of the heat treatment boat of FIG. 8.

Below the reaction tube 101 there is provided a cap body 131 for air-tightly closing the bottom opening of the reaction tube 101 while wafers are loaded in the reaction tube 101. The cap body 131 is provided on a boat elevator 103 which is moved up and down by a lift mechanism not shown. On the cap body 131 there is provided a heat insulating cylinder 106 which provides a heat insulating unit. The heat insulating cylinder 106 comprises a quartz cylindrical container 161 filled with quartz wool 162. As shown in FIGS. 8 and 9, a ring-shaped intermediate member 107 of a material having high radiant heat absorption, e.g., SiC whose upper diameter is larger than a lower diameter thereof is provided on the heat insulating cylinder 106 through a faucet joint portion 106A. A wafer boat 102 is mounted on the intermediate member 107 with a lower projection thereof engaged in the intermediate member 107. The intermediate member 107 functions as a mounting member for the wafer boat 102, and acts to suppress heat radiation from the lower part of the wafer boat 102 while heated. The intermediate member 107 has a height of, e.g., 100–200 mm.

The wafer boat 102 of a material with a high radiant heat absorption, e.g., SiC. The wafer boat 102 comprises four, for example, support rods 123 erected between a top plate 121 and a bottom plate 122, and grooves (not shown) formed in the respective support rods 123 for supporting 100 sheets, for example, of wafers W horizontal at a certain vertical interval.

The operation of the second embodiment will be explained. First the heater 110 is heated to heat the interior of the reaction tube 101 through the liner tube 112 homogeneously up to, e.g., about 800° C. Then 100 sheets, for example, of wafers W to be treated are mounted on the wafer boat 102 with the boat elevator 103 positioned below the reaction tube 101. Then the wafer boat 101 is lifted to a position where the cap body 131 closes the bottom opening of the reaction tube 101 (the state of FIG. 8) to load the wafers W into the reaction tube 101. When the wafers W are heated up to the same temperature of the atmosphere in the reaction tube 101, the heater 110 is further intensified to raise the temperature in the reaction tube 101 up to 1200° C. A processing gas is fed into the inner tube 101a from the gas feed pipe 151 through the small holes 101c while the reaction tube 101 is exhausted through the exhaust pipe 152 to maintain the interior of the reaction tube 101 under a set pressure, and a diffusion treatment, for example, is conducted on the wafers W.

The wafer boat 102 and the intermediate member 107, which are formed of SiC, quickly raise temperatures in the wafers W heating step, in the second embodiment from loading of the wafers W into the reaction tube 101 until the wafers W are stabilized up to an atmospheric temperature in the reaction tube 101 (about 800° C.), but the heat insulating cylinder 106 whose radiant heat absorption is low, slowly raises its temperature. As a result, a temperature difference occurs due to a difference in the temperature rise between the wafer boat 102 and the heat insulating cylinder 106. But the presence of the intermediate member 107, whose temperature rise is quick, between the wafer boat 102 and the heat insulating cylinder 106 suppresses temperature drops of a lower part of the wafer boat 102 due to slower temperature rises of the heat insulating cylinder 106.

That is, an amount of radiation from the lower end of the intermediate member 107 to the heat insulating cylinder 106 is considered large, but making a height (length) of the intermediate member 107 sufficient to keep the upper end of the intermediate member 107 from the influence of the radiation from the lower end of the intermediate member 107 can suppress radiation from the lower end of the wafer boat 102 to the intermediate member 107. Accordingly temperature drops of the lower part of the wafer boat 102 can be reduced. Temperature differences in plane between the supported part of each wafer W (the support rod 123 of the wafer boat 102) and the rest part thereof can be small. Accordingly thermal strain stresses can be mitigated, and less slips occur. The use of the intermediate member 107 is very effective to suppress occurrence of slips in heat treating wafers W of, e.g., 8 inches at above 1000° C.

In addition to this advantageous effect the second embodiment can provide the following advantageous effect. Quartz lowers its strength and tends to undergo thermal deformation at a high temperature of 1200° C. The mount member of quartz which is a part of the conventional heat insulating unit is located in the region surrounded by the heater, and tends to be thermally deformed. This is a problem. But in the second embodiment, the portion corresponding to the conventional mount member is formed of SiC having good high temperature strength, and the heat insulating cylinder can be kept from thermal deformation with a result of a long lifetime.

The presence of the intermediate member, which quickly raises its temperature, one the side of the lower end of the wafer boat shortens a heat recovery time (a period of time from loading of the wafers into the pre-heated reaction tube to stabilization of the wafers at an atmospheric temperature) of a part near the lower part of the wafer boat, which leads to high throughputs.

Figure 10:
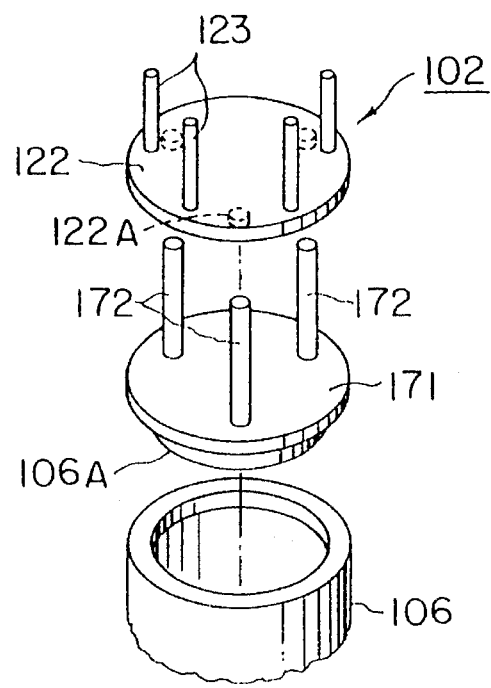
FIG. 10 is a broken perspective view of another variation of the heat treatment boat of FIG. 8.

In the second embodiment, the material of the wafer boat and the intermediate member 107 is not limited to SiC, and may be another material, such as polysilicon as long as it has high radiant heat absorption. The structure of the intermediate member 107 is not limited to the above, and may include, as shown in FIG. 10, a plurality of support rods, e.g., three support rods, erected on a disc body 171 having the upper surface closed, and the support rods 175 are inserted in blind holes 122A in a bottom plate 122 so as to support the wafer boat 102. The intermediate member 107 may be in one-piece with the wafer boat 102.

According to the second embodiment, even when temperature differences occur due to differences in temperature rise speed between the heat treatment boat (wafer boat) and the heat insulating unit, the intermediate member of high radiant heat absoprtion is provided between the heat treatment boat and the heat insulating unit reduces temperature drops of the lower part of the heat treatment boat with the result that occurrence of slips in objects to be -treated can be suppressed.

Third Embodiment

Figure 11:
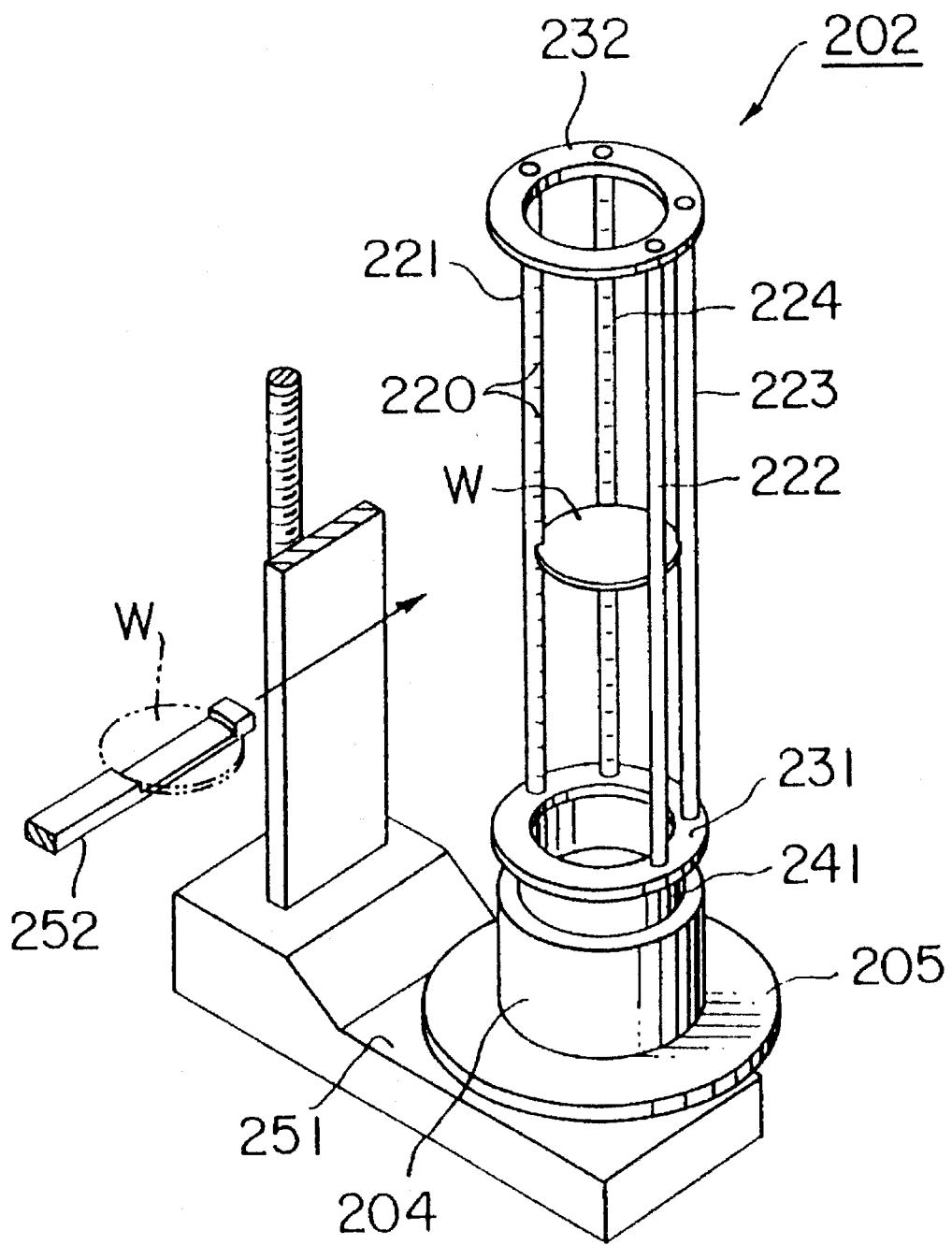
FIG. 11 is a perspective view of the heat treatment boat according to a third embodiment of the present invention showing a general structure thereof.
Figure 12:
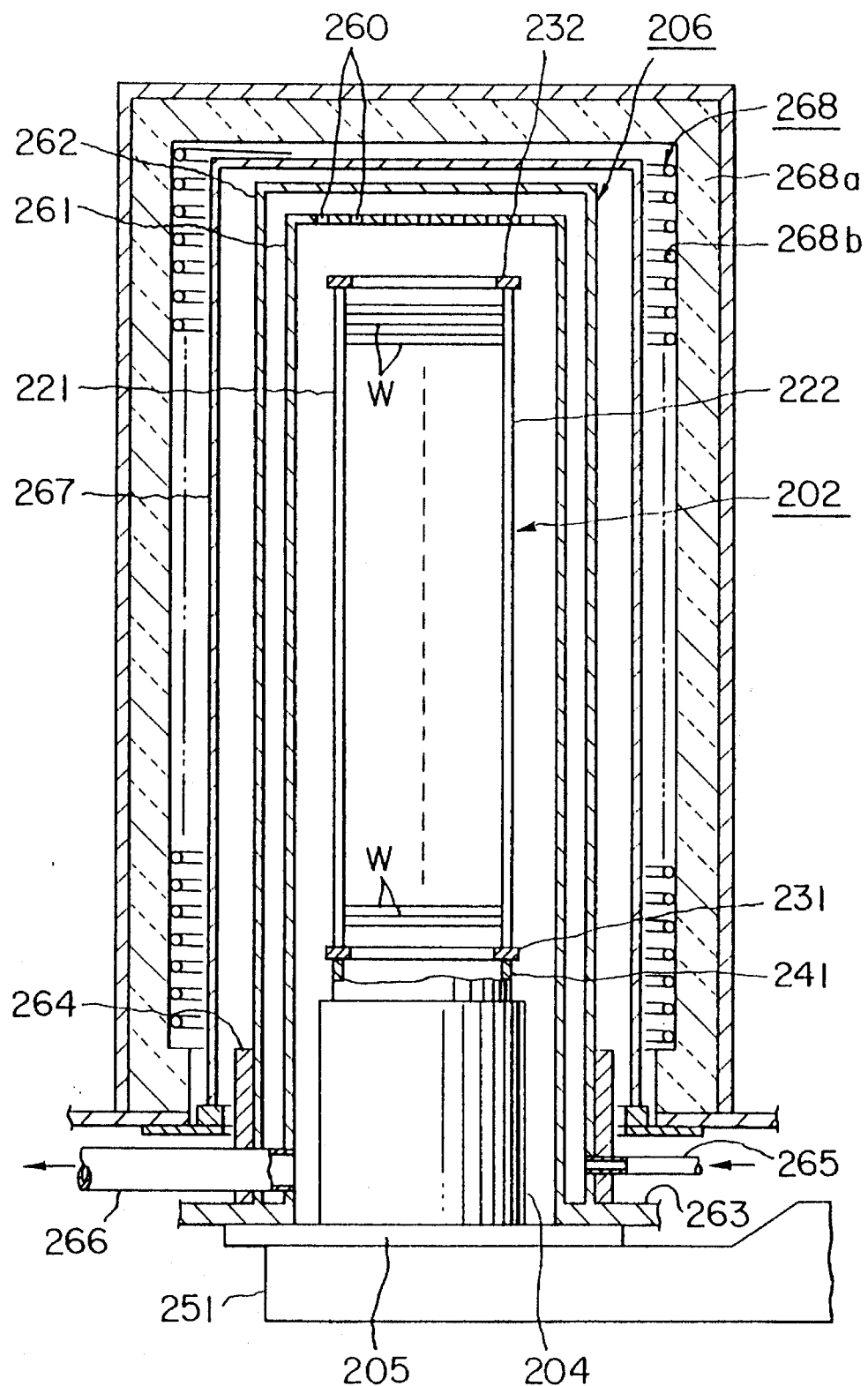
FIG. 12 is a vertical sectional view of the heat treatment boat of FIG. 11, which shows the heat treatment boat is loaded in a heat treatment furnace.

The heat treatment boat according to a third embodiment of the present invention which is applied to an oxidation and diffusion furnace. As shown in FIGS. 11 and 12, a wafer boat 202 used in the third embodiment includes four support rods 221–224 which are planted vertical circumferentially in the upper surface of an annular support member 231, and which are secured at the upper ends by an annular fixation member 232. Grooves 220 are formed in the respective support rods 221–224 at a vertical interval for supporting peripheral parts of the undersides of wafers W. Two 221, 222 of the support rods 221–224 support the wafers at a left and a right positions on the side near to entrance of the wafers into the wafer boat 202. The rest two support rods 223, 224 are positioned so as to support the wafers at a left and a right positions on the side remote from entrance of the wafers into the wafer boat 202. The support rods 221–224, and the support member 231 and the fixation member 232 are formed of, e.g., SiC, but their material is not necessarily limited to SiC and may be, e.g., quartz.

The wafer boat 202 is disposed, through a heat insulating unit, a heat insulating cylinder 204 of, e.g., quartz on a cap body 205 which is to close a bottom opening of a reaction tube which will be explained later. The cap body 205 is disposed on a boat elevator 251. An annular stand 241 is formed on the upper surface of the heat insulating cylinder 204, and the wafer boat 202 is disposed on the stand 241.

A vertical furnace is disposed above the wafer boat 202. The structure of the vertical furnace will be briefly explained with reference to FIG. 12 showing the state in which the wafer boat 202 is loaded in the vertical furnace. A reaction tube 206 providing a heat treatment region has a double tube structure including an inner tube 161 and an outer tube 262 and is secured to a base plate not shown at a flange 263 on the lower end. The outer peripheral surface of a lower end portion of the reaction tube 206 is covered by a heat insulating material 264. A gas feed pipe 265 is connected to a side of the outer tube 262. An exhaust pipe 266 is connected to the inner tube 261 for exhausting the interior of the reaction tube 206.

The reaction tube 201 is surrounded on the outside by a cylindrical liner tube 267 of, e.g., SiC. The liner tube 267 is surrounded on the outside by a heater 268. The heater 268 comprises a coil of a resistance heating line 268b provided inside a heat insulating layer 268a.

Here flow of heat in the wafer boat 202 will be explained. As seen in FIG. 12, the support rod 221 is heated by radiant heat of the heater 268 through the liner tube 267. Since no heaters are present above and below the wafer boat 202, secondary radiation takes place from the upper and the lower ends of the wafer boat 202, i.e., the fixation member 232 and the support member 231, and the heat is radiated. But the fixation member 232 and the support member 231 are annular, and their radiation areas are small.

Figure 13:
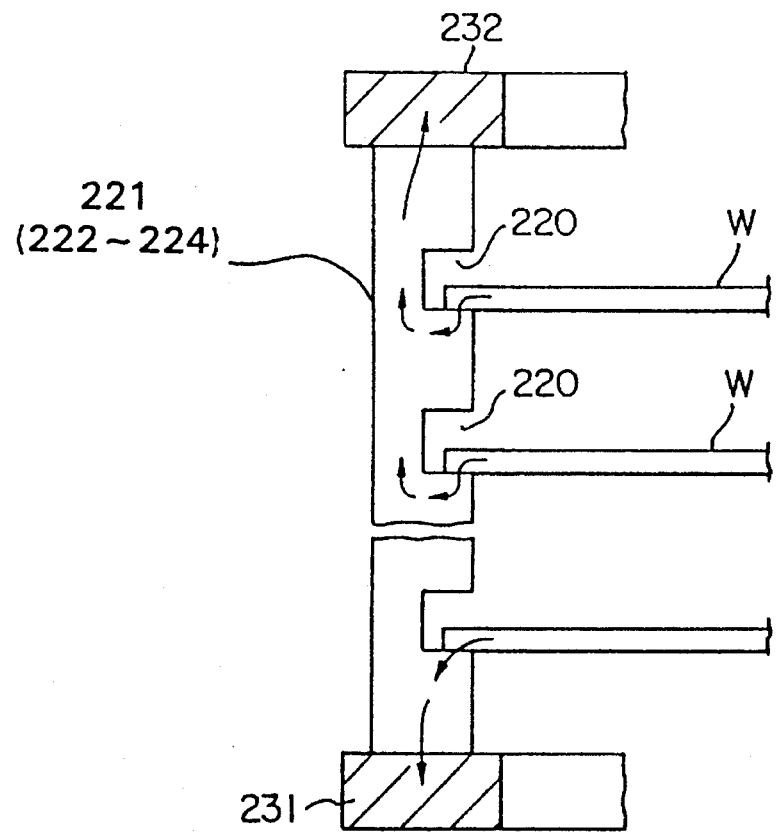
FIG. 13 is a diagrammatic view explanatory of heat conduction in the heat treatment boat.

The heat flowing in the loop of FIG. 13 (indicated by the arrows) from the wafers W to the support surfaces of the grooves 220 of the support rods 221–224 to the upper end portions (lower end portions) of the support rods 221–224 is small in comparison with that of the conventional wafer boat having the solid top plate and bottom plates. As a result, temperature differences between the upper and the lower end portions of the support rods 221–224, and the rest parts thereof are small. Temperature uniformity in plane of the wafers are so high that thermal stresses in the peripheral parts of the wafers supported in the grooves 220 are small, and occurrence of slips can be suppressed.

Figure 14:
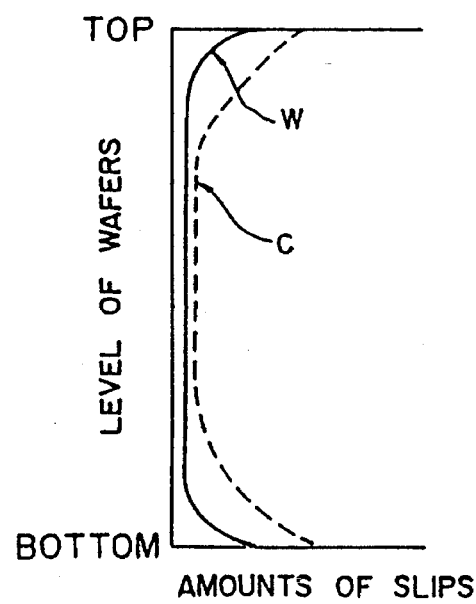
FIG. 14 is characteristic curves of slip occurrence rates for the third embodiment of the present invention and the prior art.

The advantageous effect of the third embodiment is shown in FIG. 14. Amounts of slips (a length of slips formed in one sheet of wafer) are taken on the horizontal axis. Levels of the wafers in the wafer boat are taken on the vertical axis. The solid line indicates results of the third embodiment (W), and the dot line indicates results of the conventional wafer boat (C). As seen in FIG. 14, in the third embodiment, amounts of slips are smaller near the upper and the lower end portions of the wafer boat in comparison with the conventional wafer boat. The amounts of slips sharply decrease toward the center. In contrast to this, in the conventional wafer boat (chain line) the curve of decreases of amounts of slips is blunt. As seen from these results, according to the third embodiment, occurrence of slips can be suppressed over a wide vertical range of the wafer boat, and throughput can be accordingly high.

Figure 15:
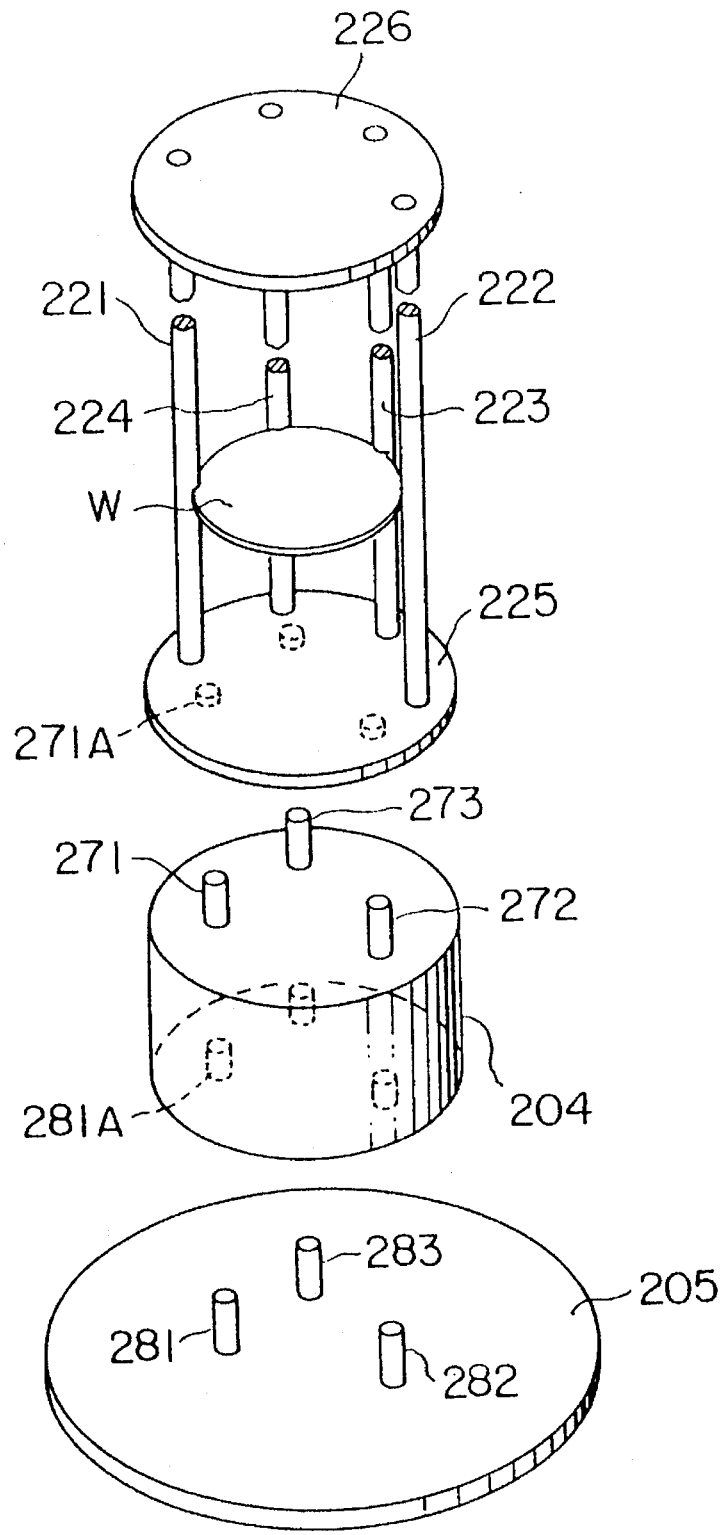
FIG. 15 is a perspective view of a modification of the heat treatment boat of FIG. 11.

The third embodiment may have the structure of FIG. 15 for suppressing occurrence of slips. In the example of FIG. 15, the wafer boat 202 has a bottom plate 225 and a top plate 226 which are in the form of solid plates. Three, for example, members 271–273 of small horizontal section are disposed on the upper surface of the heat insulating cylinder 204 at circumferentially trisected positions. The support members 171–173 support the wafer boat 202 at three points. Also on the upper surface of the cap body 205, three support members 281–283 of small horizontal section are disposed at circumferentially trisected positions. The three support members 281–284 support the heat insulating cylinder 204 at three points.

In this structure, heat is radiated by heat conduction from the bottom of the wafer boat 202 through the heat insulating cylinder 204 to the cap body 205. Against this heat flow, the support members 271–273, and the support members 81–283 act as heat conduction suppressing regions, in other words, the heat conducting path is restricted, whereby the downward heat radiation is suppressed. Calories escaping from the peripheral parts of the wafers W to the support rods 221–224 is accordingly so small that thermal stresses in the peripheral parts of the wafers W are small, and occurrence of slips can be suppressed.

Wafers W were heated at 1200° C. for 5 hours by the heat treatment apparatus using the wafer boat of this structure and the conventional apparatus. This heating was conducted 3 times, and wafers W were replaced by new ones for each heating. A total length of the slips in the lowest wafers W in the conventional apparatus was about 25 mm, and that of this embodiment was about 6 mm. It was confirmed that structure of this embodiment is superior.

This embodiment may have both the structure of FIG. 11 and that of FIG. 15. A vertical heat treatment apparatus having both structures is shown in FIG. 16. In forming the heat conduction suppressing regions (in the above-described embodiment the regions where the support members 271–273; 281–283 are disposed) between the wafer boat 202 and the heat insulating cylinder 204, and between the heat insulating cylinder 204 and the cap body 205, the support is not necessarily the three-point support and may be four-point support. It is preferred to minimize the area of the support point to suppress heat conduction.

Figure 17:
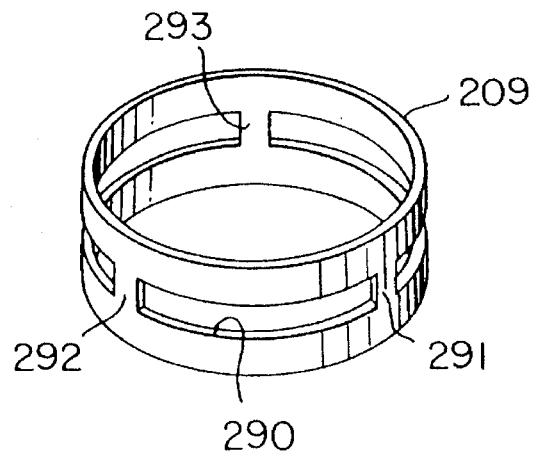
FIG. 17 is a perspective of further another variation of the support member of the heat treatment boat of FIG. 11.
Figure 18:
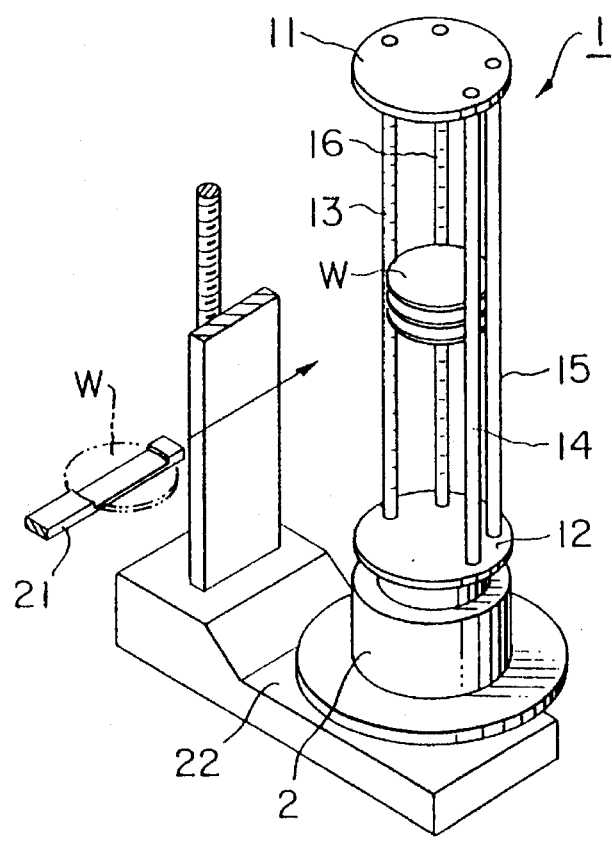
FIG. 18 is a perspective view of the conventional heat treatment boat.
Figure 19:
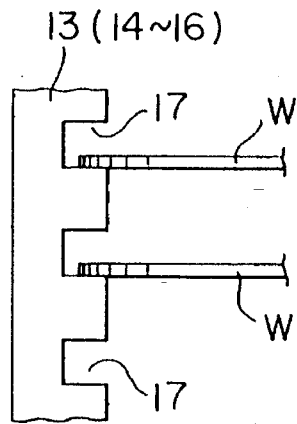
FIG. 19 is a partial enlarged vertical sectional view of a wafer support member of the conventional heat treatment boat.
Figure 20:
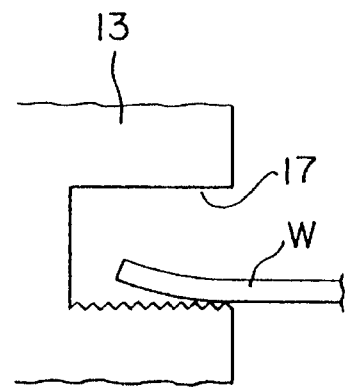
FIG. 20 is a partial enlarged vertical sectional view of a wafer support member of the conventional heat treatment boat.
Figure 21:
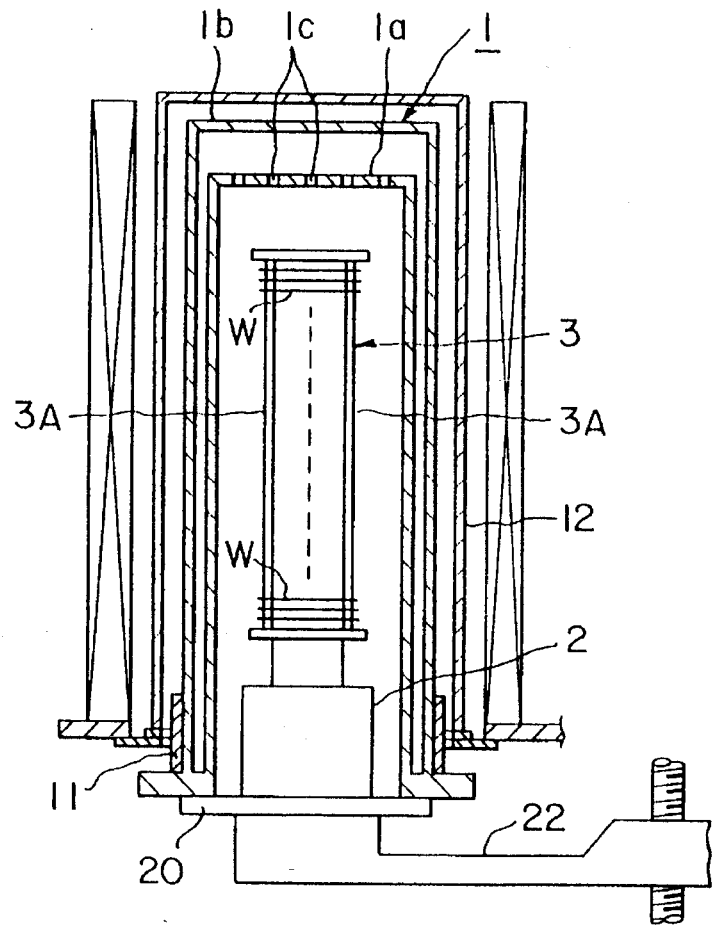
FIG. 21 is a vertical sectional view of conventional heat treatment boat loaded in a heat treatment furnace.

Such heat conduction suppressing region may be formed either of between the heat insulating cylinder 204 and the wafer boat 202, and between the heat insulating cylinder 204 and the cap body 205. In place of erecting the support members on the heat insulating cylinder 204 and the cap body 205, a cylindrical intermediate member 209 as exemplified in FIG. 17 may be separately prepared, and for restricting the heat path slits 290 are formed circumferentially in the middle of the side with three islands 291–293 left.

What is claimed is:

1. A heat treatment boat disposed on a heat insulating unit of a heat insulating material, and mounting a number of disc-shaped objects to be treated at a vertical interval on a plurality of erected support rods for heat treatment in a vertical heat treatment furnace, the heat treatment boat comprising:

an annular support member for supporting the lower ends of the support rods; and an annular fixation member for positioning the upper ends of the support rods with respect to each other.

2. The heat treatment boat according to claim 1, wherein a heat conduction restricting region is supported by a plurality of islands of narrow and small cross section between the heat insulating unit and the heat treatment boat.

3. The heat treatment boat according to claim 1, wherein a heat conduction restricting region supported by a plurality of islands of narrow and small section cross between the heat insulating unit and a cap body for closing the throat of the furnace.

* * * * *